US009083143B2

(12) United States Patent
Okumura

(10) Patent No.: US 9,083,143 B2
(45) Date of Patent: Jul. 14, 2015

(54) LASER LIGHT SOURCE MODULE

(75) Inventor: Fujio Okumura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/991,410

(22) PCT Filed: Dec. 28, 2011

(86) PCT No.: PCT/JP2011/080420
§ 371 (c)(1),
(2), (4) Date: Jun. 3, 2013

(87) PCT Pub. No.: WO2012/093637
PCT Pub. Date: Jul. 12, 2012

(65) Prior Publication Data
US 2013/0259075 A1    Oct. 3, 2013

(30) Foreign Application Priority Data

Jan. 7, 2011    (JP) ................. 2011-001866

(51) Int. Cl.
*H01S 5/02*    (2006.01)
*H01S 3/10*    (2006.01)
(Continued)

(52) U.S. Cl.
CPC .............. *H01S 3/10* (2013.01); *H01S 5/02296* (2013.01); *H01S 5/042* (2013.01); *H01S 5/005* (2013.01); *H01S 5/02* (2013.01); *H01S 5/02212* (2013.01); *H01S 5/06825* (2013.01); *H01S 5/4025* (2013.01)

(58) Field of Classification Search
CPC ........ H01S 5/02; H01S 5/02248; H01S 5/005

USPC .................................. 372/38.02, 38.09, 38.1
See application file for complete search history.

(56) References Cited

U.S. PATENT DOCUMENTS

| 7,110,825 B2 | 9/2006 | Vaynberg et al. |
| 7,530,832 B2 | 5/2009 | Takeda et al. |

(Continued)

FOREIGN PATENT DOCUMENTS

| JP | 2001-267670 A | 9/2001 |
| JP | 2006-523122 A | 10/2006 |

(Continued)

OTHER PUBLICATIONS

International Search Report (ISR) (PCT Form PCT/ISA/210) dated Mar. 19, 2012, in PCT/JP2011/080420.

*Primary Examiner* — Yuanda Zhang
*Assistant Examiner* — Michael Carter
(74) *Attorney, Agent, or Firm* — McGinn IP Law Group, PLLC

(57) ABSTRACT

The present invention provides a laser light source module thereby providing better prevention against actions taken to use the laser light for purposes other than the intended purpose, and a laser light source module according to the present invention provides a laser light source module including a laser element that emits laser light, the laser light source module being formed by a combination of a plurality of members, the laser light source module including: a laser element drive circuit including a memory that stores a password, said laser element drive circuit making said laser element emit laser light if an input password that has been input matches the password stored in said memory; and a laser element destruction mechanism that, if the plurality of members are separated, destroys said laser element.

13 Claims, 18 Drawing Sheets

(51) Int. Cl.
*H01S 5/022* (2006.01)
*H01S 5/042* (2006.01)
*H01S 5/40* (2006.01)
*H01S 5/00* (2006.01)
*H01S 5/068* (2006.01)

(56) References Cited

U.S. PATENT DOCUMENTS 7,722,226 B2 * 5/2010 Kamijima ............... 362/362
7,729,042 B2   6/2010 Egawa 2005/0145605 A1 *  7/2005 Faour et al. ............ 219/121.7
2005/0271101 A1 * 12/2005 Diaz et al. ............ 372/38.02

FOREIGN PATENT DOCUMENTS

| | | |
|---|---|---|
| JP | 2007-19476 A | 1/2007 |
| JP | 2008-135508 A | 6/2008 |
| JP | 2008-171657 A | 7/2008 |
| JP | 2009-164443 A | 7/2009 |
| JP | 2009-181984 A | 8/2009 |
| WO | WO 2004/078021 A2 | 9/2004 |

* cited by examiner

Fig.9
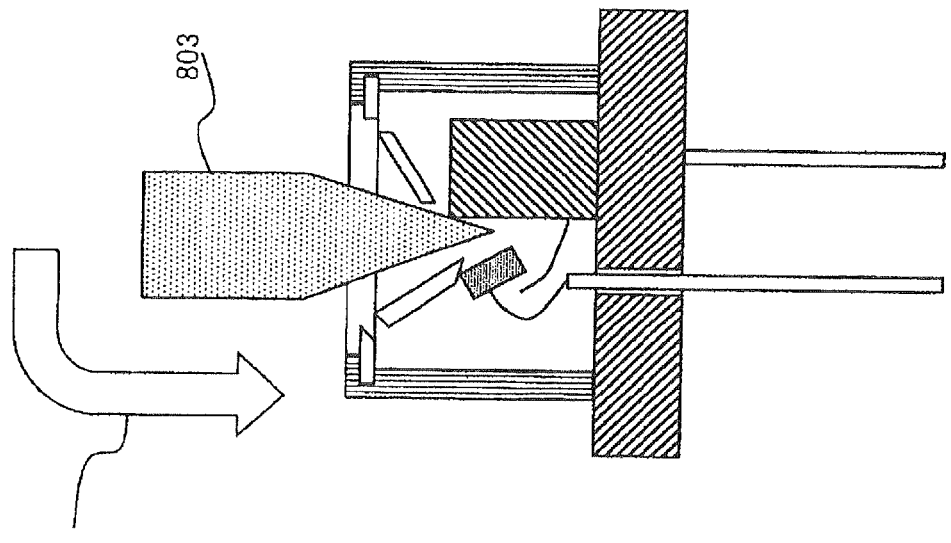
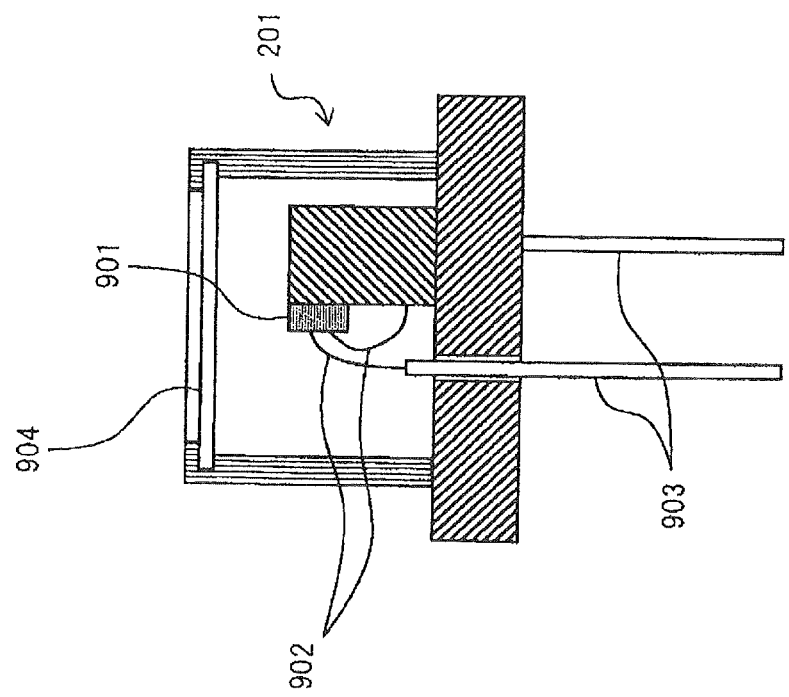

Fig.17
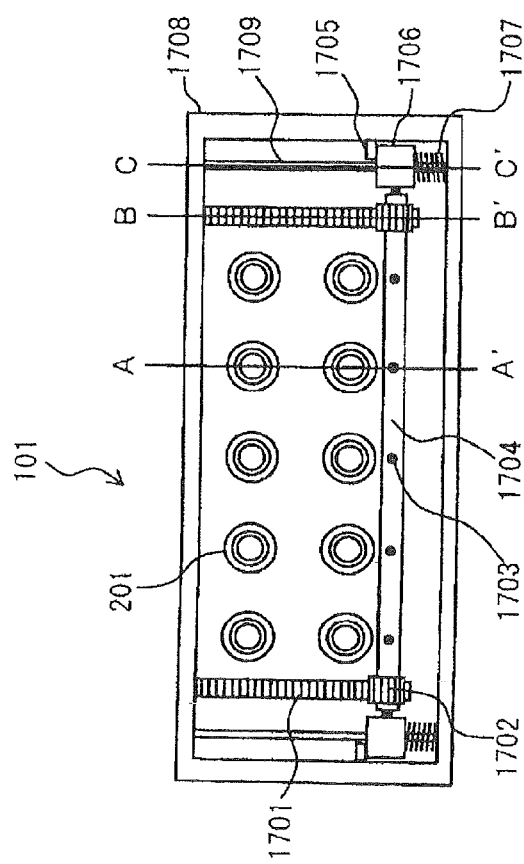
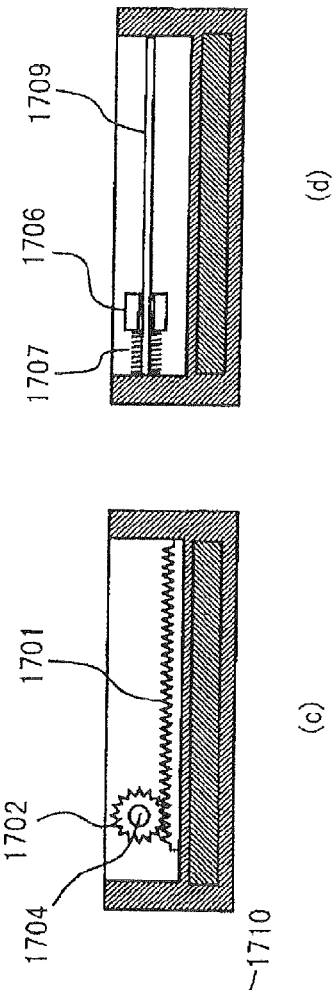
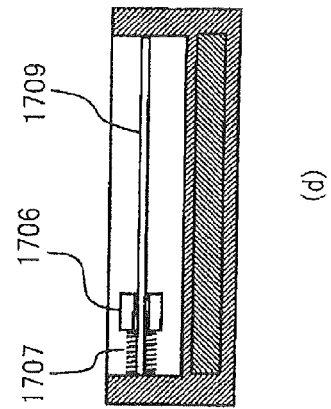

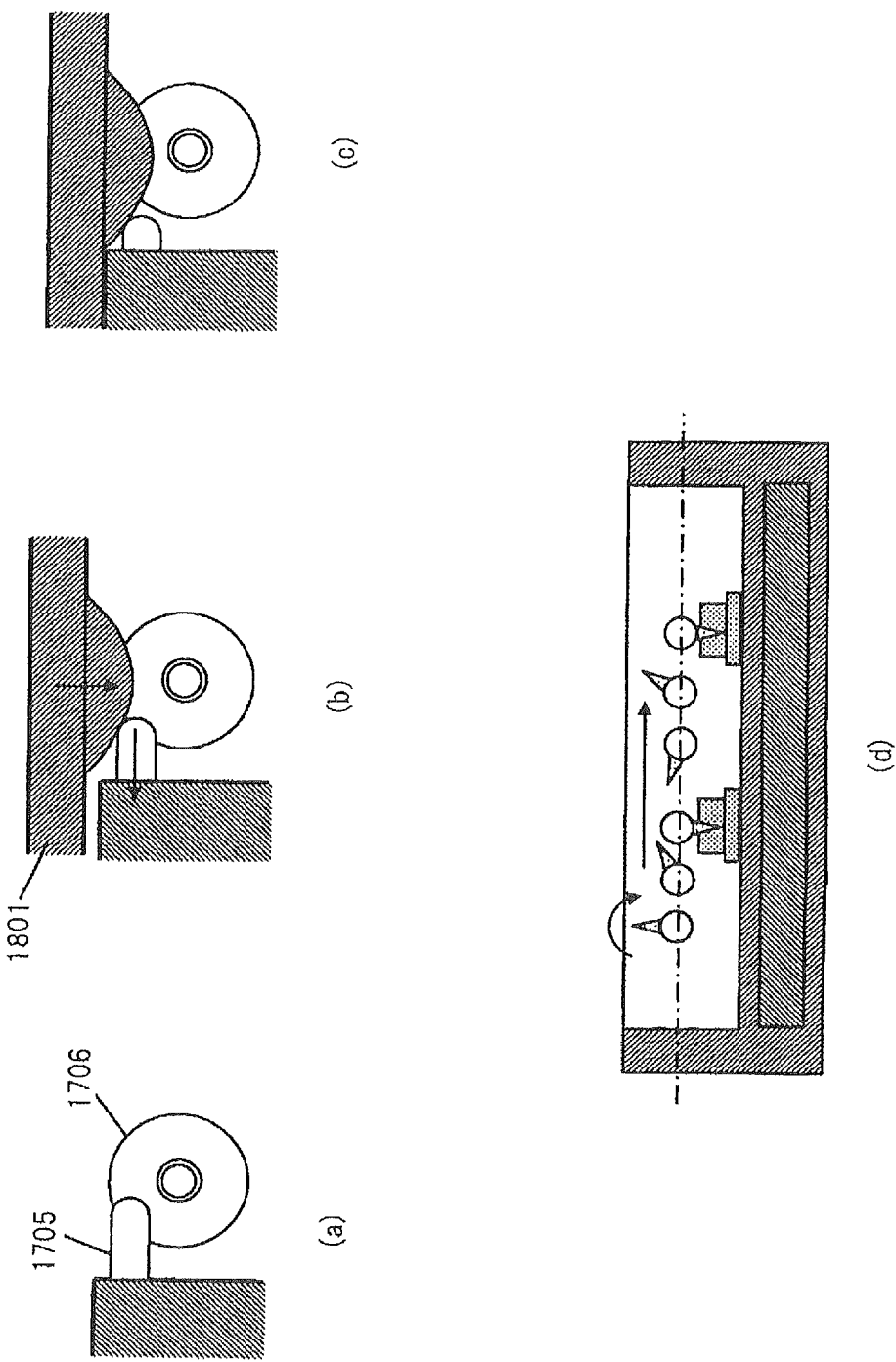

LASER LIGHT SOURCE MODULE

TECHNICAL FIELD

The present invention relates to a laser light source module used as a light source for, e.g., a projector, a laser scalpel or a laser process apparatus, the laser light source being arranged in the casing of an apparatus, and specifically relates to a laser light source module using a semiconductor device.

BACKGROUND ART

Laser light is used in various apparatuses because of its characteristics such as a constant wavelength, high movement linearity and efficient obtaining of linearly-polarized light. In recent years, semiconductor lasers that emit high-power visible light have been used, and use of such semiconductor lasers to manufacture a small-size and high-luminance projector has been proposed.

Since laser light emitted from a laser light source has high energy per unit area, if a laser light source is removed from various apparatuses and laser light is used for a purpose other than its intended purpose, there is a high risk that an accident will occur. Thus, various proposals have been made to prevent a laser light source from being removed from various apparatuses with the laser light source remaining in a condition in which the laser light source laser can emit light.

Patent Literature 1 (JP2008-171657A) discloses a light source module including a light source section that supplies light, a support section that supports the light source section, a covering section that covers the light source section, a wiring section that connects a current supply section that supplies current to the light source section and the light sources section, and a blade section arranged at a position on the support section side of the wiring section so as to extend through the covering section.

Patent Literature 1 describes that with the configuration described above, if the covering section is removed in order to remove the light source module from the light source section, since the blade section is arranged at a position on the support section side of the wiring section so as to extend through the covering section, the wiring section is cut by a blade section along with the removal of the covering section, whereby power supply to the light source section is shut off.

Patent Literature 2 (JP2007-01 9476A) discloses an apparatus including a laser light source section including a light emission section that emits light, a support section that supports the laser light source section, a fixing member that fixes the laser light source section to the support section, and disconnection means for disconnecting a current channel through which current is supplied to the light emission section in the laser light source section in conjunction together with a step of ending the fixed state of the laser light source section provided by the fixing member when the laser light source section is removed from the support section.

Patent Literature 2 describes that with the configuration described above, if an attempt is made to end the fixed state of the laser light source section provided by the fixing member in order to remove the laser light source section from the support section such as a casing, the current channel in the laser light source section is disconnected by the disconnection means in conjunction with such motion, thereby reliably making it impossible for the laser light source section to emit light, and thus, it is possible to prevent a laser light source section from being removed from, e.g., a display apparatus for misuse.

Patent Literature 3 (JP2008-135508A) discloses an apparatus including a light emitting element that emits laser light, a support member that supports the light emitting element, a substrate fixed to the support member and electrically connected to the light emitting element, a wiring that electrically connects the light emitting element and the support member and supplies current, a cover member that covers the light emitting element fixed to the substrate, at least a part of the cover member being capable of transmitting light, and a fixing member that fixes the substrate and the cover member to each other, wherein the fixing force that a fixing member exerts between the substrate and the cover member is larger than the force that is exerted between the support member and the substrate.

Patent Literature 3 describes that with the configuration as described above, if an attempt is made to remove the cover member that covers the light emitting element in order to remove the light emitting element, since a force of adherence between the cover member and the substrate that is exerted by the fixing member is larger than a force of adherence between the substrate and the fixing member, the cover member is separated from the support member together with the substrate, whereby the wiring that connects the light emitting element and the substrate is disconnected, enabling reliable prevention of laser light emission from the light emitting element.

Patent Literature 4 (JP2009-164443A) discloses an apparatus including a light source section that emits light, a wavelength conversion element that converts a wavelength of light emitted from the light source section, a light source casing that houses at least the light source section and the wavelength conversion element, and a temperature adjuster that adjusts the temperature of the wavelength conversion element, wherein the temperature adjuster is provided outside the light source casing.

Patent Literature 4 describes that with the configuration as described above, if the body section including the light source casing is removed from the temperature adjuster, conduction of heat between the temperature adjuster and the wavelength conversion element is shut off, whereby temperature adjustment for the wavelength conversion element is stopped, resulting in lowering of wavelength conversion efficiency in the wavelength conversion element. The lowering of wavelength conversion efficiency decreases light emission from the body section, enabling a satisfactory decrease in the likelihood that it will be misused or used for purposes other than the intended purpose.

CITATION LIST

Patent Literature

Patent Literature 1: JP2008-171657A
Patent Literature 2: JP2007-01 9476A
Patent Literature 3: JP2008-135508A
Patent Literature 4: JP2009-164443A

SUMMARY OF INVENTION

Technical Problem

In each of the apparatuses described in Patent Literatures 1 to 3, although a power source for a laser apparatus provided in the apparatus itself and the laser apparatus are separated, if the laser apparatus is driven by a power source that is different from the power source for the laser apparatus, laser light is emitted.

In the apparatus described in Patent Literature 4, if the body section including the light source casing is separated from the temperature adjuster, laser light is emitted in a condition in which the wavelength conversion efficiency is lowered. As described above, since laser light has high energy per unit area, even in a condition in which the wavelength conversion efficiency is lowered, laser light is very dangerous if it enters a human body, in particular, eyes.

Furthermore, none of the apparatuses described in Patent Literatures 1 to 4 can provide measures to counter efforts to alter the laser element itself in order to use laser light for a purpose other than its intended purpose such as cutting a part of the casing of the apparatus and removing the laser element to make the laser element emit laser light.

An object of the present invention is to provide a laser light source module that can better prevent the use of laser light for purposes other than the intended purpose by means of a password to activate a laser element at a time when it is used as a laser light source module, and by means of a mechanism by which, if the laser element is removed from the laser light source module to the outside, the laser element will be destroyed.

Solution to Problem

A laser light source module according to the present invention provides a laser light source module including a laser element that emits laser light, the laser light source module being formed by combination of a plurality of members, the laser light source module including:

a laser element drive circuit including a memory that stores a password, said laser element drive circuit making said laser element emit laser light if an input password that has been input matches with the password stored in said memory; and a laser element destruction mechanism that if the plurality of members are separated, destroys said laser element.

Advantageous Effects of Invention

In the invention according to the present application, which includes the above configuration, no operation is performed unless the password is the right one. Furthermore, in a situation in which a laser element is removed to the outside, the laser element itself is destroyed by the laser element mechanism, thereby providing better prevention against actions taken to use the laser light for purposes other than the intended purpose.

BRIEF DESCRIPTION OF DRAWINGS

FIGS. 9(a) and 9(b) are cross-sectional diagrams for describing the manner of destruction of laser element 201 by destruction needle 803.

FIG 10(a) illustrates a state before lower cover 207 is attached; FIG 10(b) illustrates a state in which lower cover 207 is attached, and FIG 10(c) illustrates a state where lower cover 207 is removed and destruction needle 803 moves.

FIG 15(a) illustrates a state in which upper cover 1406 and lower cover 1407 are combined; and FIG 15(b) illustrates a state in which upper cover 1406 and lower cover 1407 are separated, whereby laser elements 201 are destroyed.

FIGS. 16(a) and 16(b) are cross-sectional diagrams illustrating a state before upper cover 1406 is attached; FIGS. 16(c) and 16(d) are cross-sectional diagrams after attachment of upper cover 1406, FIG 16(e) is a top view illustrating a state before upper cover 1406 is attached, and FIG 16(f) is a top view illustrating a state after attachment of upper cover 1406.

FIG. 17 includes cross-sectional diagrams illustrating another exemplary embodiment of a structure that, if laser array unit 101 is disassembled or destroyed, destroys laser elements 201 in laser array unit 101 illustrated in FIG 1: FIG 17(a) is a top view illustrating a state in which upper cover 1801 is not attached; and FIGS. 17(b), 17(c) and 17(d) are a cross-sectional view taken along line A-A', a cross-sectional view taken along line B-B' and a cross-sectional view taken along line C-C' in FIG 17(a).

FIGS. 18(a) to 18(d) are cross-sectional diagrams illustrating another exemplary embodiment of a structure that, if laser array unit 101 is disassembled or destroyed, destroys laser elements 201 in laser array unit 101 illustrated in FIG 1.

DESCRIPTION OF EXEMPLARY EMBODIMENTS

Next, exemplary embodiments of the present invention will be described with reference to the drawings.

Figure 1:
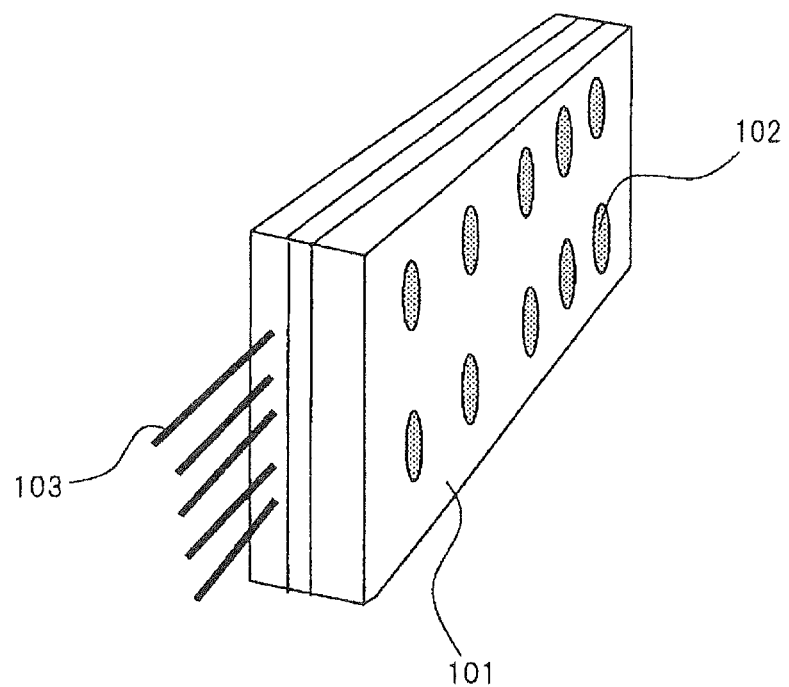
FIG. 1 is a perspective diagram illustrating a configuration of laser array unit 101 used in a laser light source module according to the present invention.

FIG 1 is a perspective diagram illustrating a configuration of laser array unit 101 used in a laser light source module according to the present invention. Collimating lenses 102 are formed at a surface of laser array unit 101 that serves as a surface from which laser light is emitted, and laser light is emitted by laser elements provided inside via collimating lenses 102. Wirings 103 for supplying power to, and/or performing control of the laser elements, are provided on a side surface of laser array unit 101.

Figure 2:
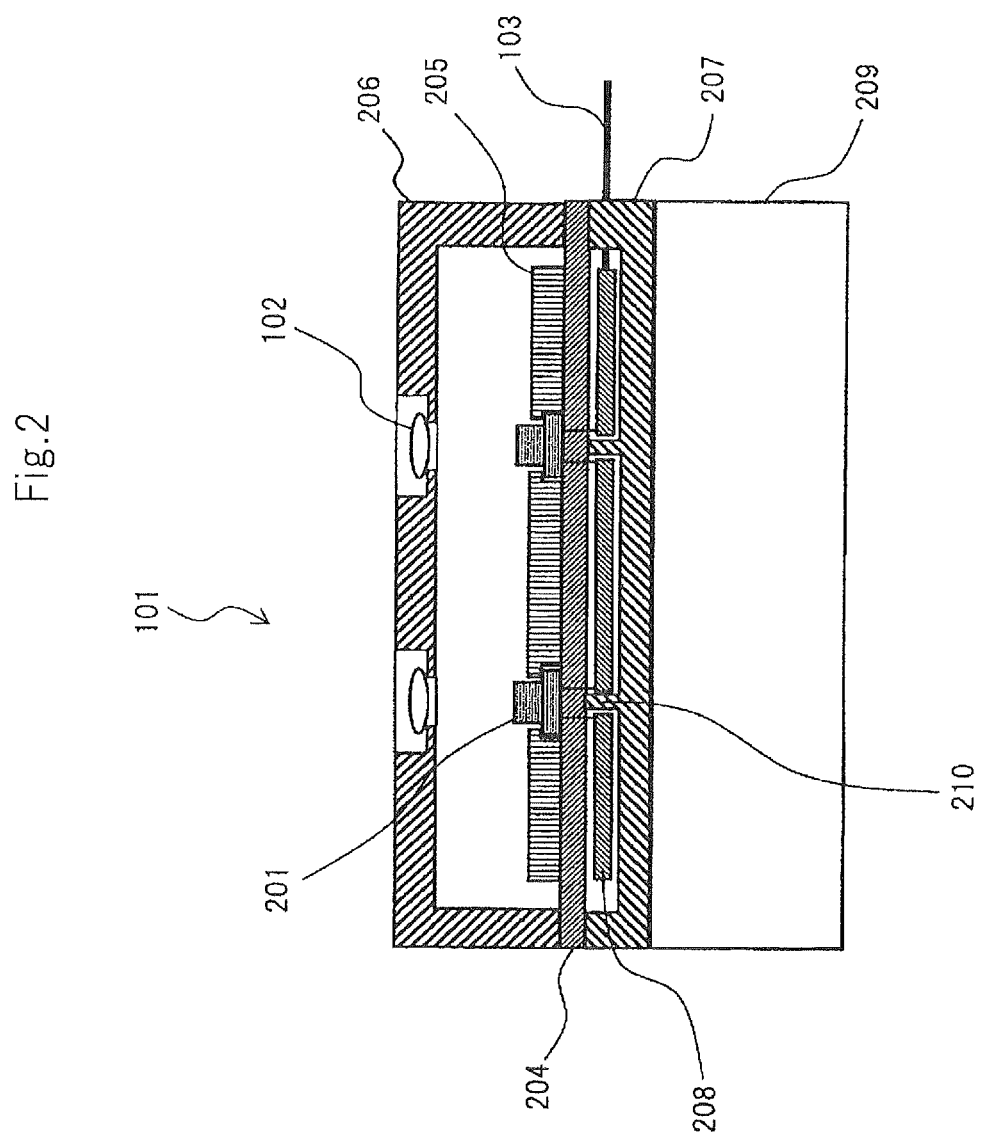
FIG. 2 is a cross-sectional diagram illustrating a basic structure of laser array unit 101.

FIG 2 is a cross-sectional diagram illustrating a basic structure of laser array unit 101.

Laser elements 201 are arranged on laser element fixing substrate 204 in a state in which laser elements 201 are pressed by holding plate 205. An upper surface of laser array unit 101 is covered by upper cover 206 and a lower surface of laser array unit 101 is covered by lower cover 207. Collimating lenses 102 are disposed in parts of upper cover 206 that correspond to laser elements 201, and laser light emitted by laser elements 201 exits to the outside through collimating lenses 102.

In lower cover 207, circuit substrate 208 for driving laser elements 201 is housed. Circuit substrate 208 drives laser elements 201 according to a control signal sent via wirings 103. Laser array unit 101 illustrated in FIG 2 is installed on, and thereby cooled by, cooling unit 209 for water cooling or air cooling, and in lower cover 207, protrusions 210 protruding toward respective laser elements 201 are provided, and holes through which protrusions 210 are inserted are provided in laser element fixing substrate 204 and circuit substrate 208. Consequently, protrusions 210 are in contact with laser elements 201 and heat generated in laser elements 201 is conducted to cooling unit 209, whereby efficient cooling is achieved.

Figure 3:
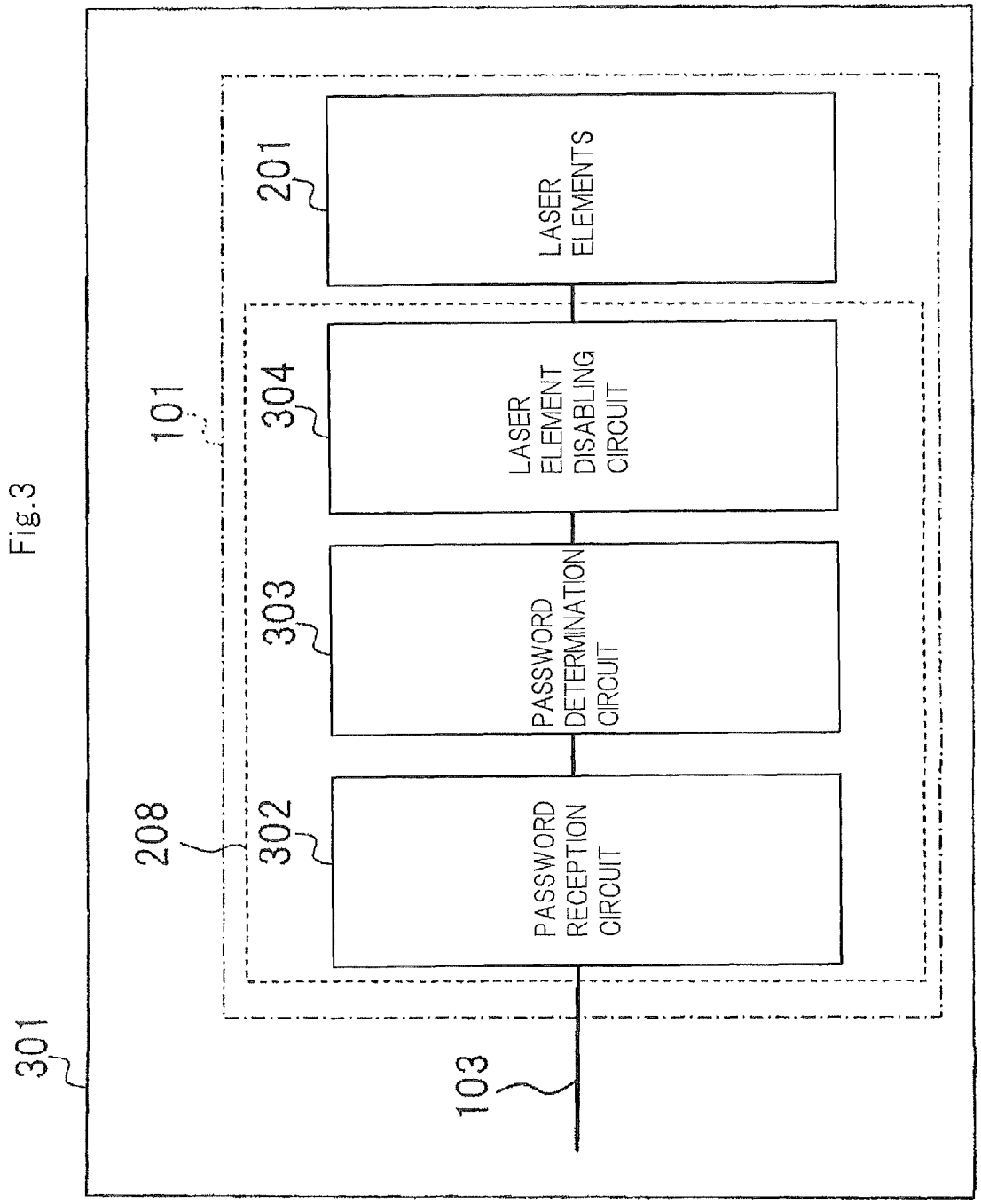
FIG. 3 is a block diagram illustrating an electrical configuration of an exemplary embodiment of projector 301 using laser array unit 101 as a light source.

FIG 3 is a block diagram illustrating the electrical configuration of an exemplary embodiment of projector 301 using laser array unit 101 as a light source. The configuration according to the present exemplary embodiment is a configuration of a general projector except for the light source, and thus, only the laser light source module is illustrated, and illustration and description of parts other than the laser light source module will be omitted.

Circuit substrate 208 that drives laser elements 201 includes password reception circuit 302, password determination circuit 303 and laser element disabling circuit 304.

Figure 4:
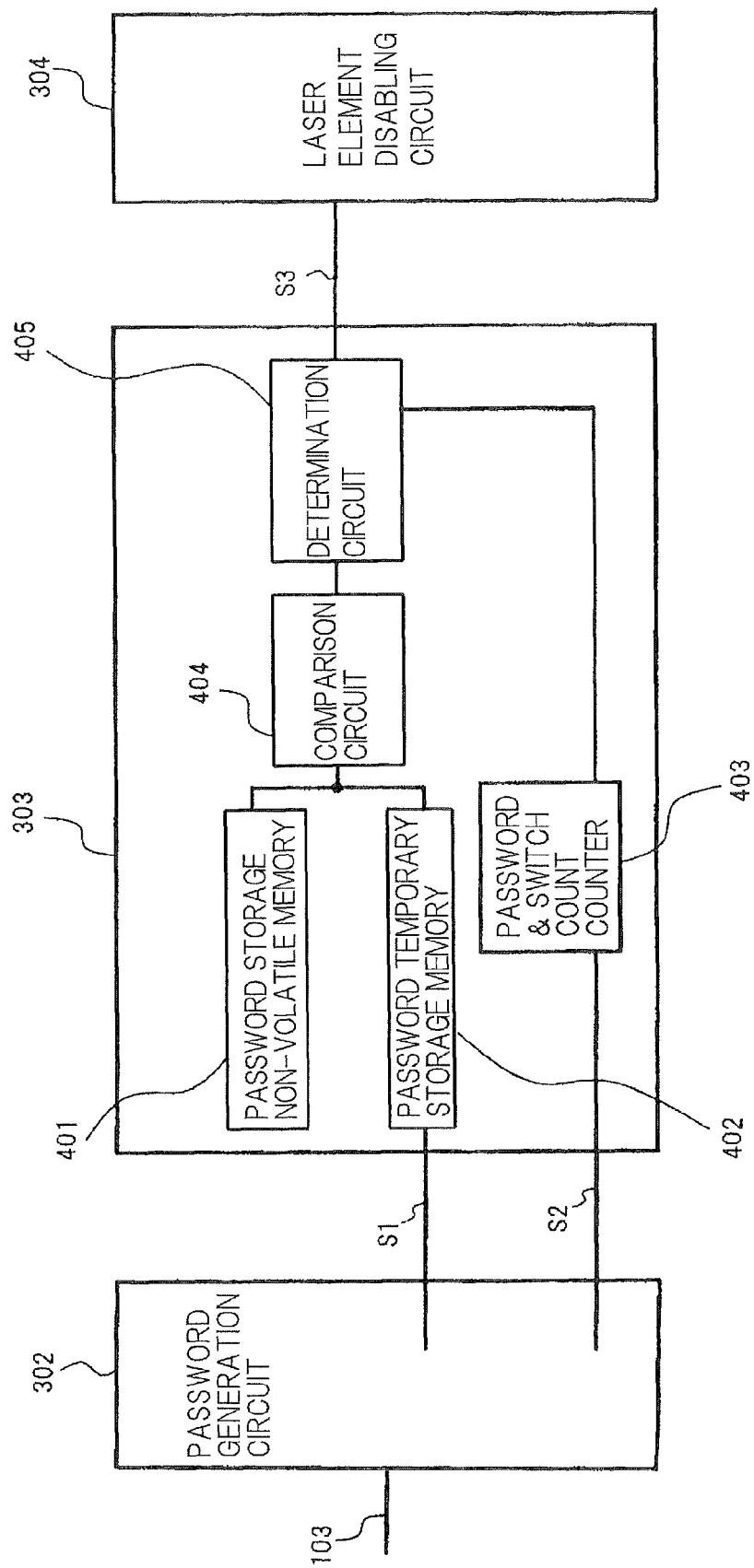
FIG. 4 is a block diagram illustrating a configuration of password determination circuit 103.

FIG 4 is a block diagram illustrating a configuration of password determination circuit 103.

Password determination circuit 303 includes password storage non-volatile memory 401, password temporary storage memory 402, switch count counter 403, comparison circuit 404 and determination circuit 405.

Password storage non-volatile memory 401 is intended to store a password, and the stored password to be stored is set and stored at the time of shipment in a factory in which laser array unit 101 was manufactured.

A control signal via wiring 103 contains a password, and password generation circuit 302 provides password output S1 to password temporary storage memory 402 every time a new password is input. Also, password generation circuit 302 outputs switch signal S2 to password & switch count counter 403 every time password output S1 is provided.

Password temporary storage memory 402 stores an input password, and password & switch count counter 403 counts up every time password output S1 is provided, and thus, the number of times that password output S1 was provided can be checked by checking the count value in password & switch count counter 403.

Every time password temporary storage memory 402 stores an input password, comparison circuit 404 compares the input password stored in password temporary storage memory 402 and the password stored in password storage non-volatile memory 401 and outputs a comparison result indicating whether or not these passwords match each other to determination circuit 405.

If the output of comparison circuit 404 indicates that the input password and the stored password match each other, determination circuit 405 outputs determination signal S3 indicating that power supply to laser elements 105 is provided, to laser element disabling circuit 304. Consequently, laser element disabling circuit 304 provides power supply to laser elements 201.

Also, if the output of comparison circuit 404 indicates that the input password and the stored password do not match each other, determination circuit 405 checks the count value in password & switch count counter 403 to determine whether or not the count value is equal or smaller than a predetermined number of times, for example, three times. If the count value is equal to or smaller than the predetermined number of times, determination signal S3 indicating that no power supply to laser elements 201 is provided, to laser element disabling circuit 404. Consequently, laser element disabling circuit 404 provides no power supply to laser elements 201.

Also, if the output of comparison circuit 404 indicates that the input password and the stored password match each other and it is determined that the count value in password & switch count counter 403 exceeds the predetermined number of times, determination circuit 405 outputs determination signal S3 indicating that power supply to laser elements 201 is disabled, to laser element disabling circuit 404. Consequently, laser element disabling circuit 404 performs processing for disabling the power supply to laser elements 201.

Figure 5:
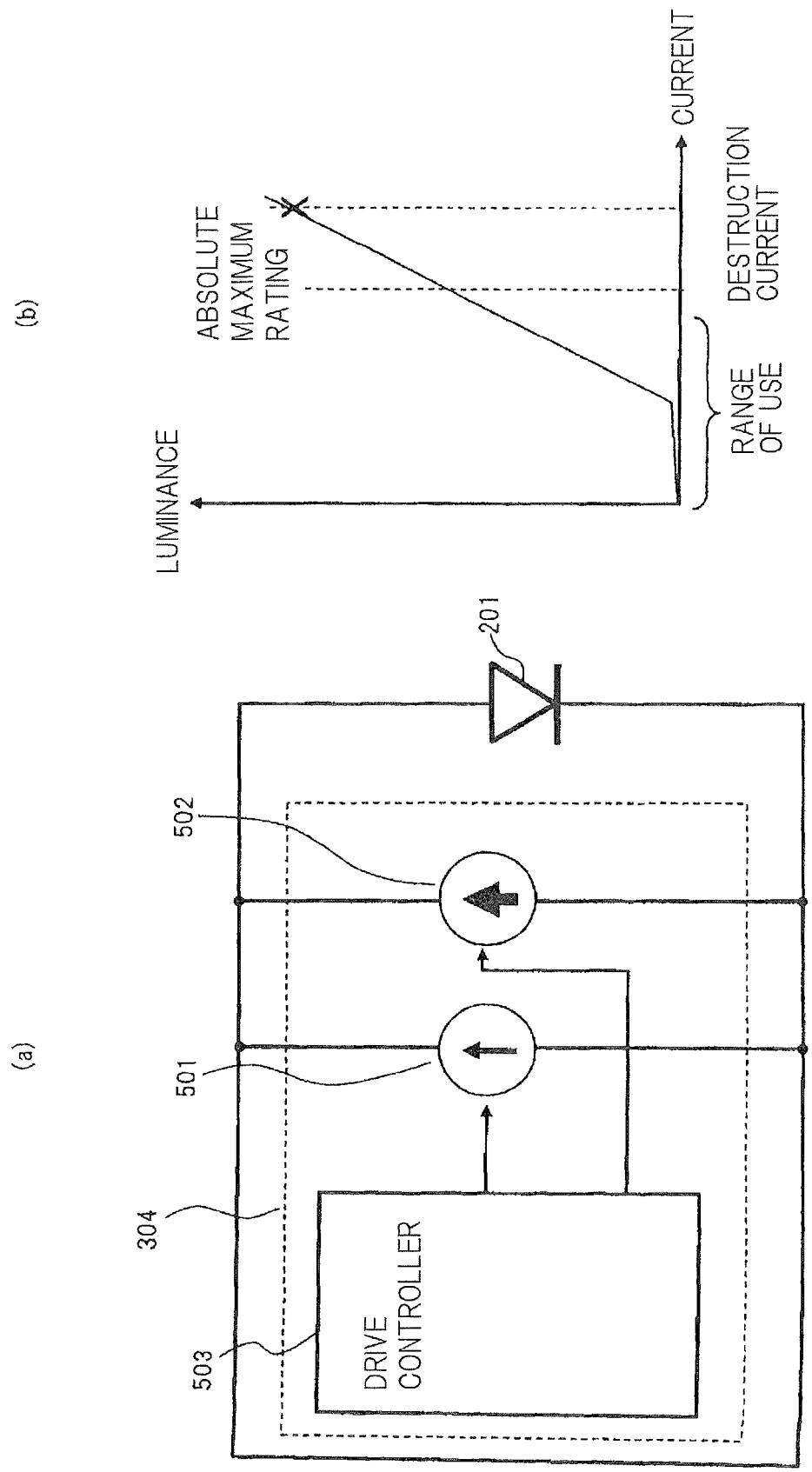
FIG. 5(a) is a block diagram illustrating a configuration of an exemplary embodiment of laser element disabling circuit 304.
FIG 5(b) is a diagram indicating a current-luminance characteristic of a laser element.

FIG 5(a) is a block diagram illustrating a configuration of an exemplary embodiment of laser element disabling circuit 304.

Laser element disabling circuit 304 according to the present exemplary embodiment includes ordinary use current source 501 that supplies current to laser elements 201, laser element destruction current source 502, and drive controller 503 that orders current supply by ordinary use current source 501 or by laser element destruction current source 502 according to the content of determination signal S3.

As indicated in the current-luminance characteristic in FIG 5(b), laser elements are ones whose luminance is determined according to the current value if the current is equal to or exceeds a certain value, but the elements are destroyed if the current becomes destruction current that exceeds an absolute maximum rating.

If drive controller 503 receives determination signal 53 indicating that power supply to laser elements 201 is provided, from determination circuit 405 (see FIG 4), drive controller 503 causes current supply to be provided by ordinary use current source 501 that supplies current equal to or lower than the absolute maximum rating, and if drive controller 503 receives determination signal S3 indicating that power supply to laser elements 201 is disabled, from determination circuit 405, drive controller 503 causes current supply to be provided by laser element destruction current source 502 that supplies destruction current, thereby destroying laser elements 201.

Figure 6:
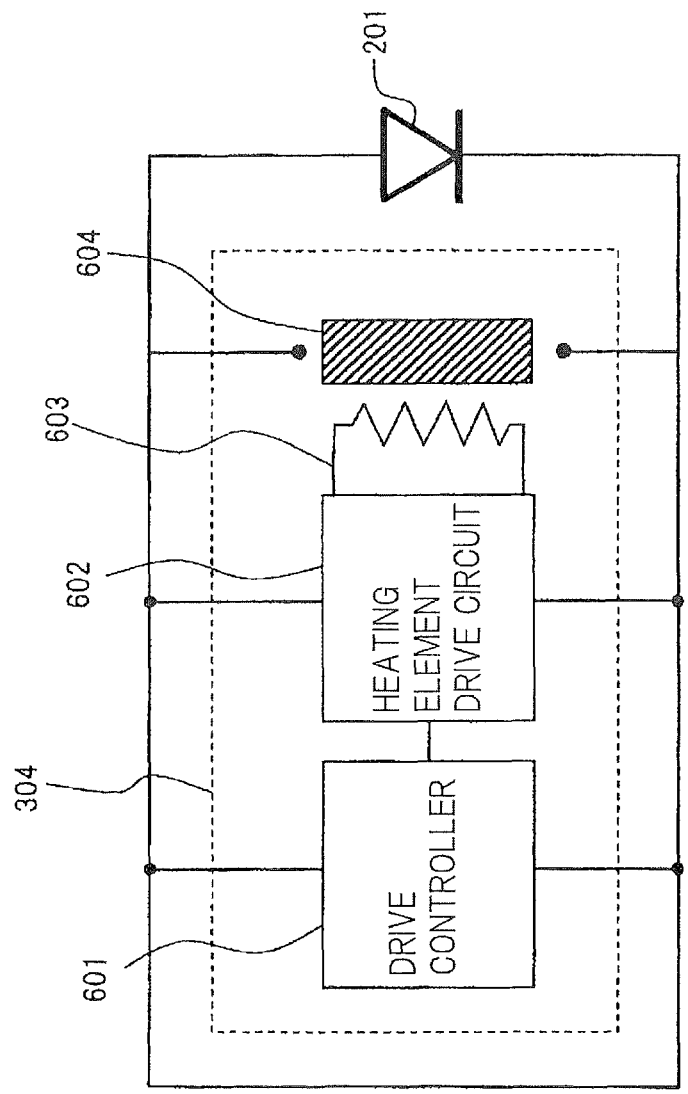
FIG. 6 is a block diagram illustrating a configuration of another exemplary embodiment of laser element disabling circuit 304.

FIG 6 is a block diagram illustrating the configuration of another exemplary embodiment of laser element disabling circuit 304.

Laser element disabling circuit 304 in the present exemplary embodiment includes heating element drive circuit 602 provided in parallel to laser elements 201, conductive material 604, drive controller 601 that makes heating element drive circuit 602 operate according to determination signal S3, and heating element 603 that generates heat by means of drive current from heating element drive circuit 602 to heat conductive material 604.

Upon receipt of determination signal S3 indicating that power supply to laser element 201 is disabled, from determination circuit 405, drive controller 601 makes heating element drive circuit 602 operate to make heating element 603 generate heat. Consequently, conductive material 604 is heated and melts, whereby opposite ends of laser elements 201 are shorted and no current flows in laser element 201.

Figure 7:
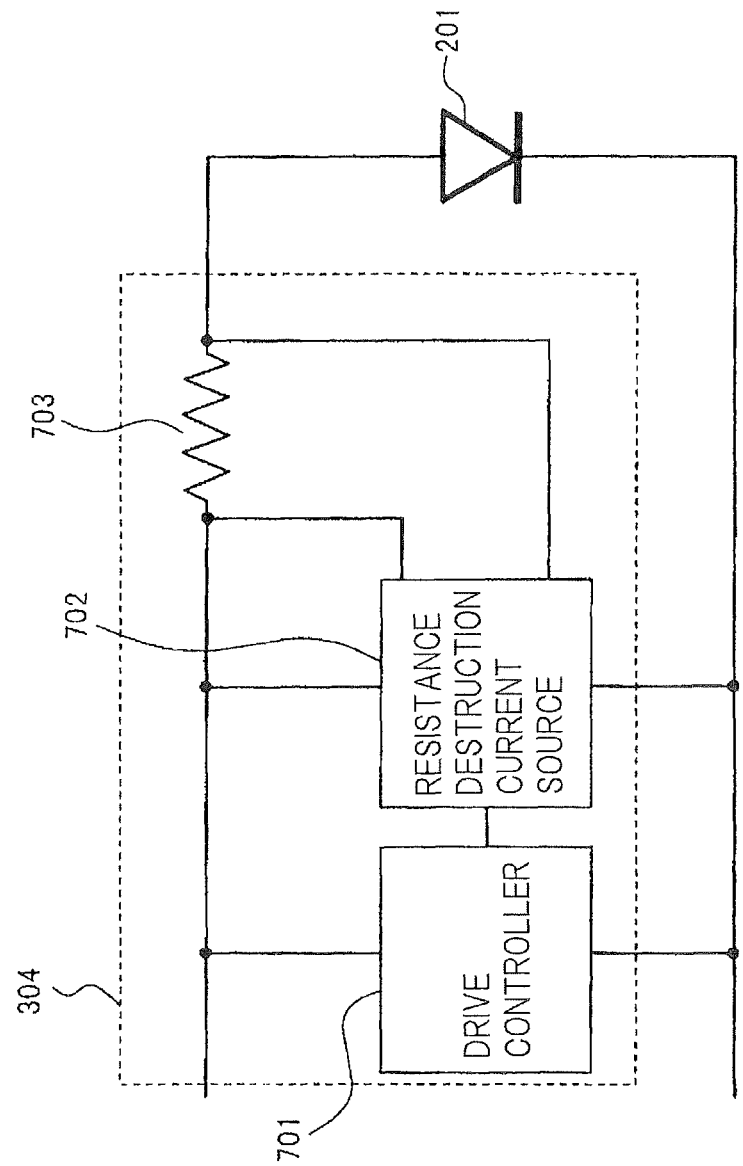
FIG. 7 is a block diagram illustrating a configuration of another exemplary embodiment of laser element disabling circuit 304.

FIG 7 is a block diagram illustrating the configuration of another exemplary embodiment of laser element disabling circuit 304.

Laser element disabling circuit 704 in the present exemplary embodiment includes resistor 703 provided in a channel of current supply to laser element 201, resistor destruction current source 702 connected to opposite ends of resistor 703 and capable of current supply only to resistor 703, and drive controller 701 that controls the operation of resistor destruction current source 702.

Upon receipt of determination signal S3 indicating that current supply to laser element 201 is disabled from determination circuit 405, drive controller 701 causes resistance destruction current source 702 to operate and generate heat to burn off resistor 703. Consequently, no current flows in laser element 201.

As described above, where laser array unit 101, which is a laser light source module, is used, a password is used as well for driving laser elements 201, and if a password that is different from a password that is stored in advance, laser elements 201 are not driven, and also if a password that is different from the stored password is successively input a number of times equal to or exceeding a predetermined number of times, the laser elements are disabled.

Next, a mechanism that, if laser elements are removed to the outside, destroys the laser elements according to the present invention, will be described. In the below description, only those structures in laser element destruction structures and structures being assembled, that can be easily understood, will be illustrated and described.

Figure 8:
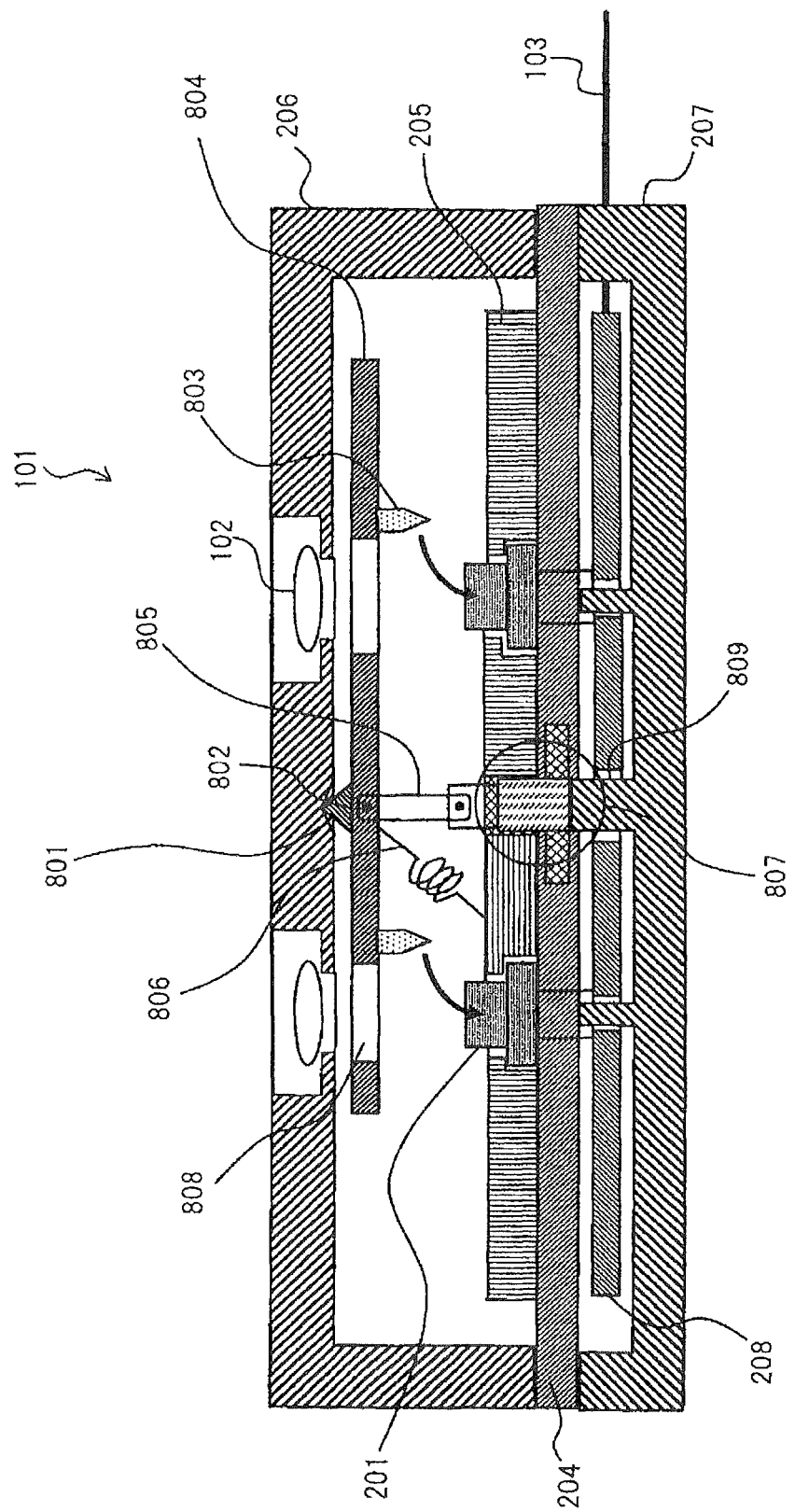
FIG. 8 is a cross-sectional diagram illustrating an exemplary embodiment of a structure that, if laser array unit 101 is disassembled or destroyed, destroys laser elements 201 in laser array unit 101 illustrated in FIG 2.

FIG 8 is a cross-sectional diagram illustrating an exemplary embodiment of a structure that, if laser array unit 101 is disassembled or destroyed, destroys laser elements 201 in laser array unit 101 illustrated in FIG 2.

In laser array unit 101 according to the present exemplary embodiment, beam 804 positioned between laser elements 201 and upper cover 06 is provided. At parts of beam 804 that correspond to laser elements 201 in the used state illustrated in FIG 8, holes 808 are formed, and consequently, laser light emitted from laser elements 201 exits via holes 808 and collimating lenses 102.

Beam 804 is pressed toward upper cover 206 via connector 805 and disengagement section 807, by protrusion 809 provided in lower cover 207. Conical holder 802 with its apex on the upper cover 206 side is formed on beam 804, and in upper cover 206, recess 801 that receives holder 802 is formed. Connector 805 pivotably supports a part of beam 804 and a part of disengagement section 807 at its respective ends thereof, and where upper cover 206 and lower cover 207 are closed, recess 801 and holder 802 are engaged and thus the state illustrated in FIG 8 is maintained.

If upper cover 206 or lower cover 207 is removed, the engagement between recess 801 and holder 802 is not maintained. Between holding plate 205 and beam 804 (or between holding plate 205 and connector 805), spring 806 is provided as biasing means for restricting the direction of pivoting of connector 805. As a result of the providing the biasing means, if upper cover 206 or lower cover 207 is removed, beam 804 moves in the direction indicated by the arrows in the Figure to cover laser elements 201, resulting in a disengaged state. At positions in beam 804 that correspond to respective laser elements 201 in the disengaged state, respective destruction needles 803 that protrude toward respective laser elements 201 are provided, and in the disengaged state, respective laser elements 201 are destroyed by respective destruction needles 803.

FIG 9 is a cross-sectional diagram for describing the manner of destruction of laser elements 201 by destruction needles 803.

As illustrated in FIG 9(a), each laser element 201 is a can-type one, and semiconductor laser 901 is connected to terminals 903 via wire bonding 902, and sealed by glass 904. As illustrated in FIG 9(b), glass 904, semiconductor laser 901 and wire bonding 901 are destroyed by destruction needles 803 that move due to the removal of upper cover 206 or lower cover 207.

Figure 10:
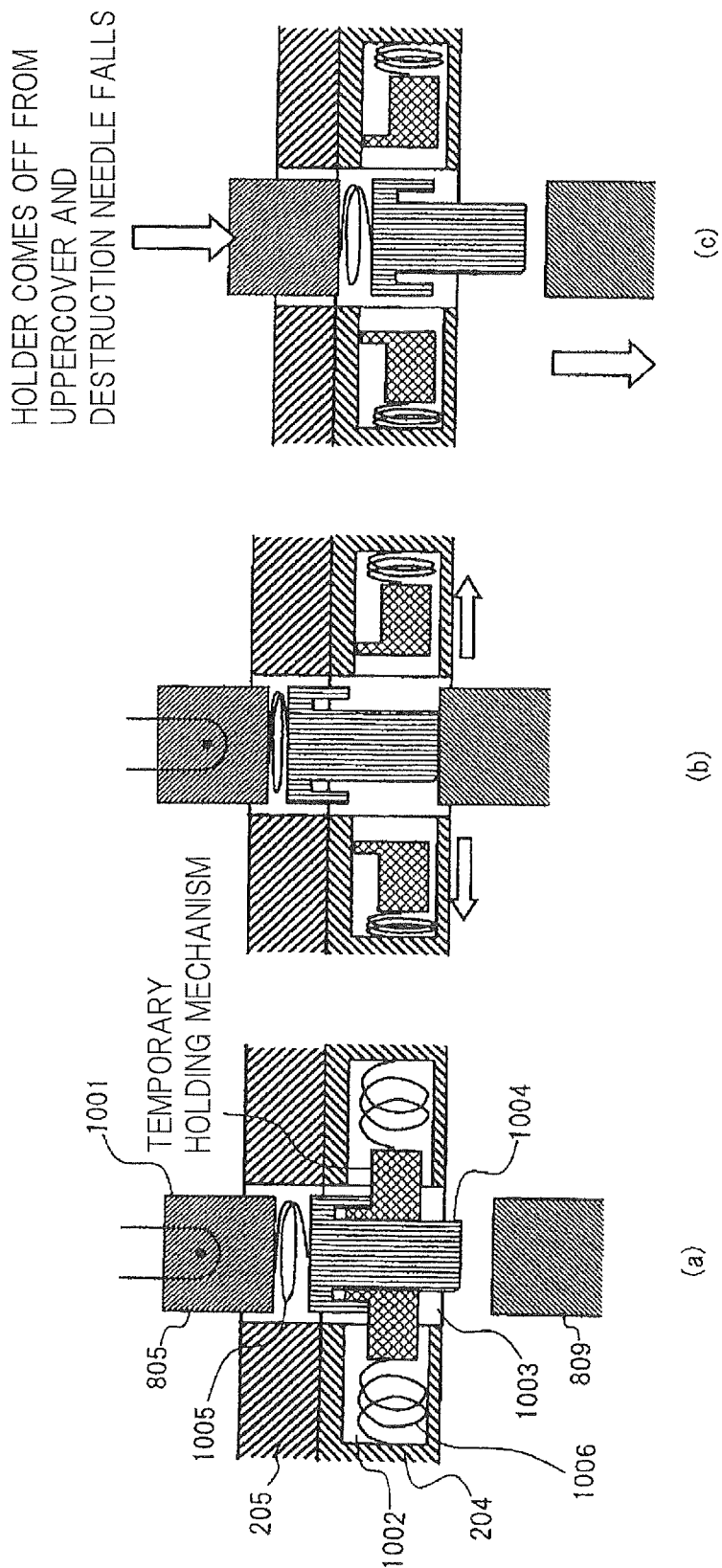
FIG. 10 includes cross-sectional diagrams each illustrating a configuration of disengagement section 807 in FIG 8.

FIG 10 includes cross-sectional diagrams illustrating a configuration of disengagement section 807 in FIG 8. FIG 10(a) is a state before lower cover 207 is attached, FIG 10(b) illustrates a state after lower cover 207 is attached, and FIG 10(c) illustrates a state in which lower cover 207 is removed and destruction needle 803 moves.

As illustrated in FIG 10(a), disengagement section 807 includes connector 1001 supported so as to pivot relative to connector 805, housing chambers 1002 formed in laser element fixing substrate 204, stoppers 1003, pressing member 1004, spring 1005 provided between connecting member 1001 and pressing member 1004, and springs 1006 provided between housing chamber 1002 and stoppers 1003.

Two housing chambers 1002, two stoppers 1003 and two springs 1006 are respectively provided symmetrically with pressing member 1004 as a center.

Pressing member 1004 includes a flange and in stoppers 1003, protrusions that can fit in the flange of pressing member 1004 are provided, and in the state before lower cover 207 is attached, which is illustrated in FIG 10(a), the protrusions and the flange are fitted each other.

In the state illustrated in FIG 10(a), spring 1005 is compressed relative to its natural length, and spring 1006 is extended relative to its natural length. Because pressing member 1004 is fitted into stopper 1003, pressing member 1004 is prevented from moving in the upward and downward directions in the Figure. Thus, connector 1001 is biased upward in the Figure by spring 1005, and the engagement between recess 801 and holder 802, which is illustrated in FIG 8, is maintained, whereby beam 804 is not rotated and laser elements 201 are thus not destroyed.

In the state in which lower cover 207 is attached, which is illustrated in FIG 10(b), pressing member 1004 is pushed by protrusion 809 upward in the Figure. Thus, pressing member 1004 and stoppers 1003 are released from the fit state, enabling compression of springs 1006, whereby stoppers 1003 are housed in housing chamber 1002.

As illustrated in FIG 10(c), upon removal of lower cover 207, pressing member 1004 moves downward in the Figure. Thus, the engagement between recess 801 and holder 802, which is illustrated in FIG 8, is cancelled, whereby beam 804 rotates and thereby laser elements 201 are destroyed.

Figure 11:
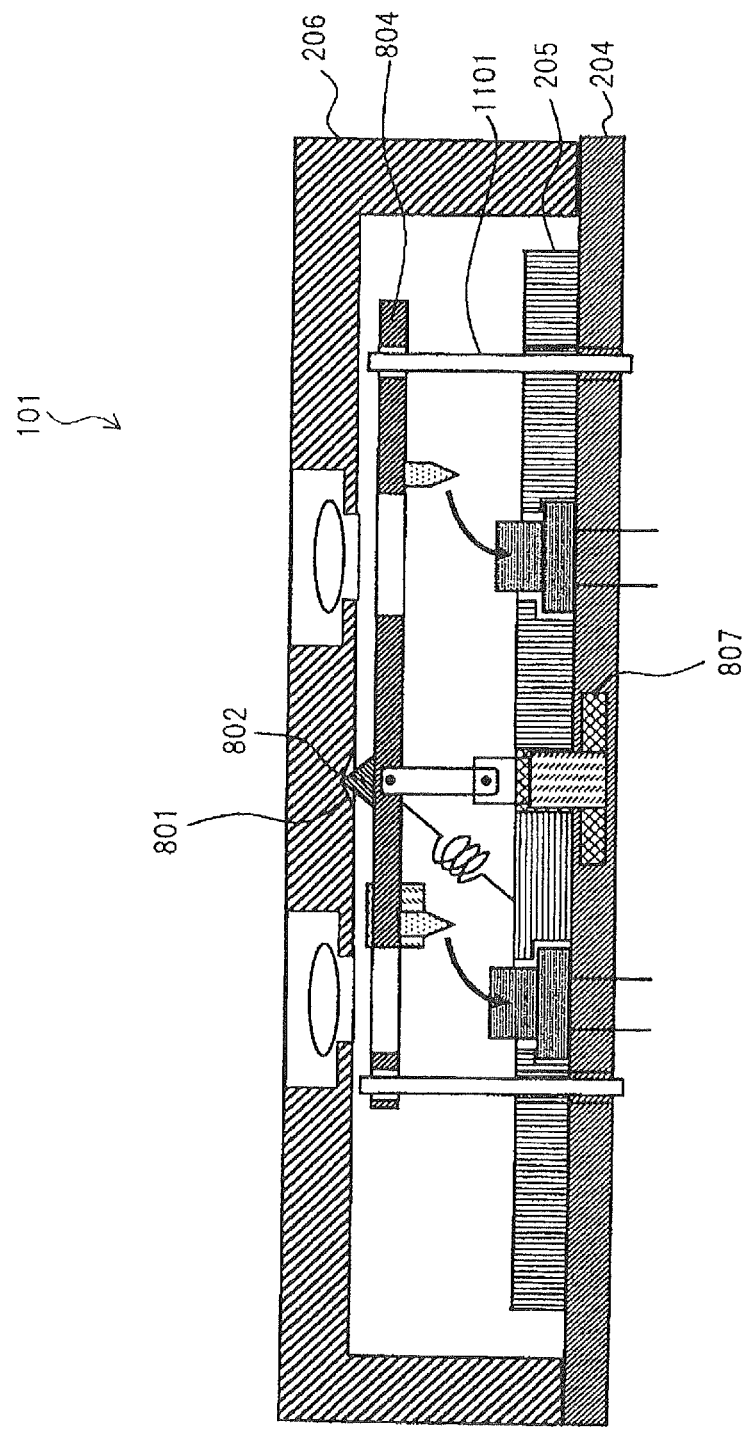
FIG. 11 is a cross-sectional diagram for describing a structure that, at the time of setting a laser element destruction mechanism in laser array unit 101 illustrated in FIG 8, prevents the destruction mechanism from operating.

FIG 11 is a cross-sectional diagram for describing a structure that, at the time of setting a laser element destruction mechanism in laser array unit 101 illustrated in FIG 8, prevents the laser element destruction mechanism from operating.

In beam 804, laser element fixing substrate 204 and holding plate 205, holes for inserting holding bars 1101 therethrough are formed. Until upper cover 206 is attached to laser element fixing substrate 204 to cause recess 801 and holder 802 engage with each other, holding bars 1101 are inserted through the respective holes to prevent beam 804 from rotating.

Once upper cover 206 is attached to laser element fixing substrate 204, holding bars 1101 are pulled out, whereby the laser element destruction mechanism provided by rotation of beam 804 enters the operable state.

Figure 12:
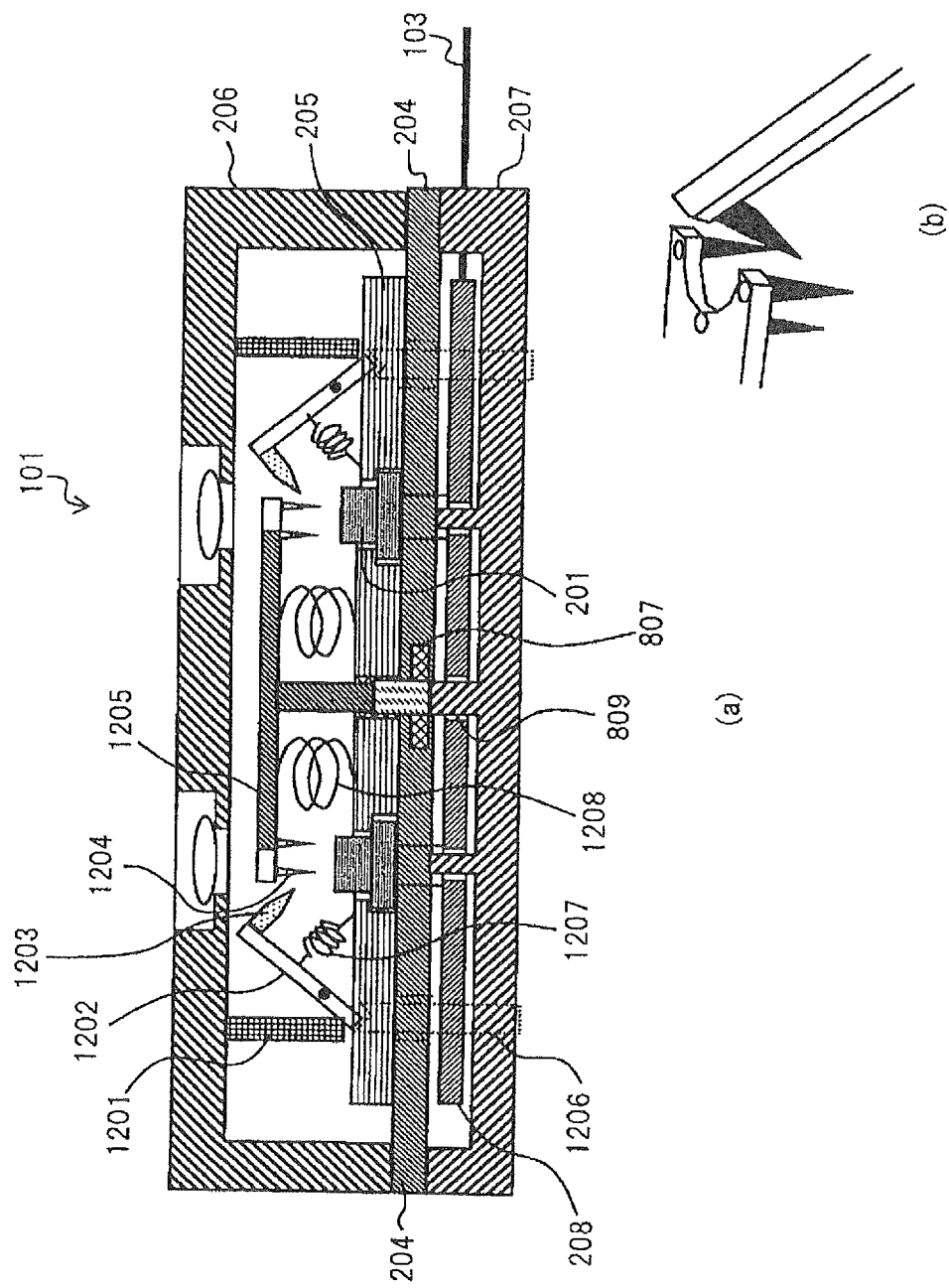
FIG. 12(a) is a cross-sectional diagram illustrating another exemplary embodiment of a structure that, if laser array unit 101 is disassembled or destroyed, destroys laser elements 201 in laser array unit 101 illustrated in FIG 2.
FIG 12(b) is a perspective diagram illustrating the inside of a dashed line in FIG 12(a) and illustrates the standby state of destruction needles.

FIG 12(a) is a cross-sectional diagram illustrating another exemplary embodiment of a structure that if laser array unit 101 is disassembled or destroyed, destroys laser elements 201 in laser array unit 101 illustrated in FIG 2, and FIG 12(b) is a perspective diagram that illustrates the inside of a dashed line in FIG 12(a) and illustrates a standby state of destruction needles.

While the exemplary embodiment illustrated in FIG 8 provides a structure that, if either of upper cover 206 or lower cover 207 is removed, destroys laser elements by means of the same mechanism, in the present exemplary embodiment, if upper cover 206 or lower cover 207 is removed, laser elements are destroyed by means of respective mechanisms that are different from each other.

In laser array unit 101 according to the present exemplary embodiment, beams 1202 for destroying laser elements 201, if upper cover 206 is removed, are provided, and beam 1205 for destroying laser elements 201, if lower cover 207 is removed, is provided.

Each beam 1202 having destruction needles 1203, that are provided on one end thereof, is pivotable, and is biased by spring 1207 so as to rotate in a direction in which destruction needle 1203 is directed to laser element 201. In the state in which upper cover 206 is attached, which is illustrated in FIG 12(a), holding bars 1201 provided at upper cover 206 are locked by respective other ends of beams 1202 to prevent rotation of beams 1202.

Upon removal of upper cover 206, holding bars 1201 are also removed, beams 202 rotate toward laser element 201, whereby laser elements 201 are destroyed by destruction needles 1203. In laser element fixing substrate 204 and holding plate 205, holes for inserting holding bars 1206 therethrough are formed. Holding bars 1206 are intended to prevent rotation of beams 1202 by holding respective ends of beams 1202 before upper cover 206 is attached to laser element fixing substrate 204, that is, rotation of beams 1202 is prevented by holding bars 1201. Holding bars 1206 are pulled out after upper cover 206 is attached to laser element fixing substrate 204.

In T-shaped beam 1205, destruction needles 1204 that protrude toward laser elements 201 are formed at parts corresponding to respective laser elements 201. Although beam 1205 is biased toward laser elements 201 by springs 1208, beam 1205 is locked by protrusion 809 and disengagement section 807, and thus, in the state in which lower cover 207 is attached, laser elements 201 are not destroyed.

Upon removal of lower cover 207, beam 1205 becomes movable, and moves toward laser elements 201, whereby laser elements 201 are destroyed by destruction needles 1204.

Figure 13:
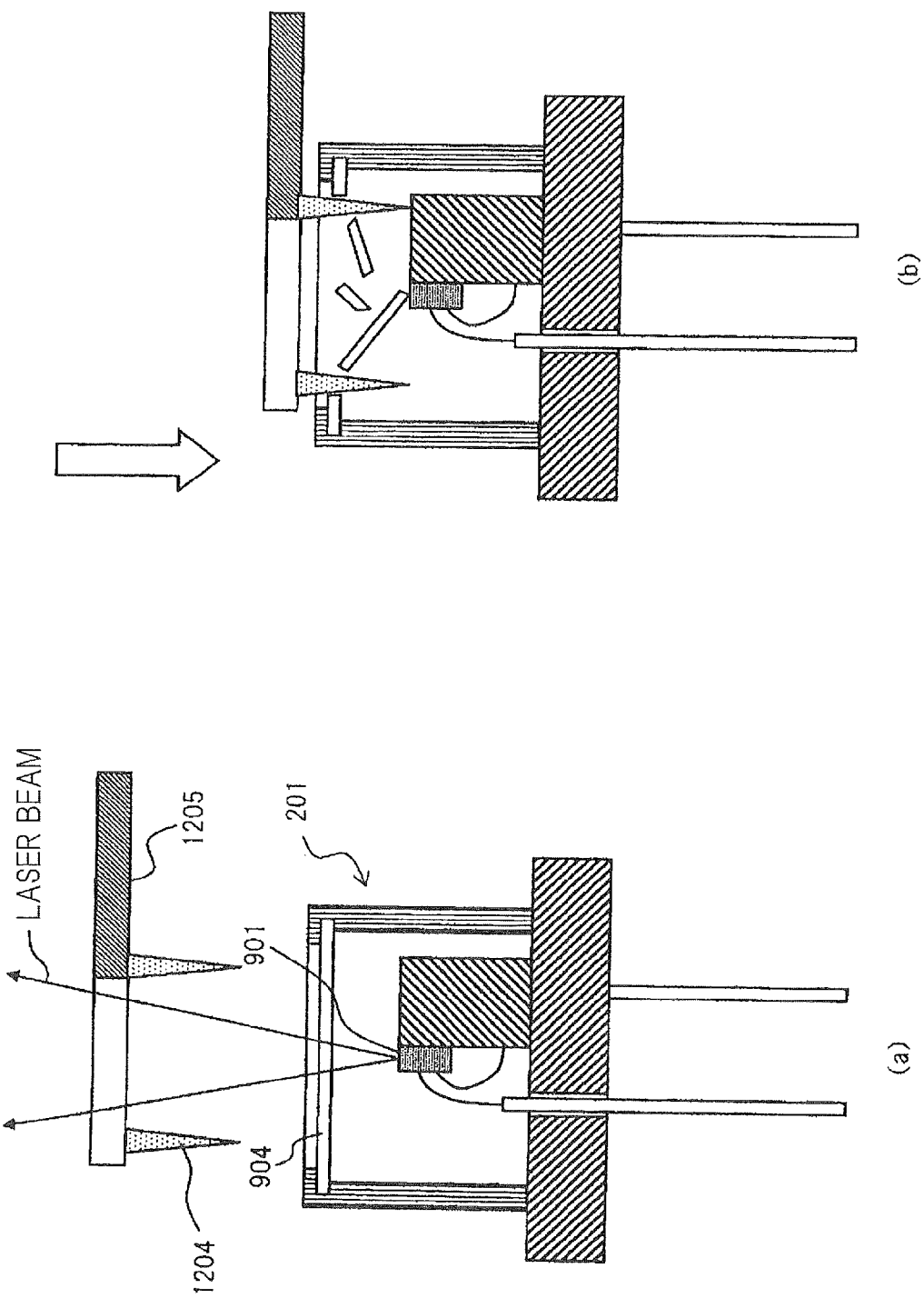
FIGS. 13(a) and (b) are cross-sectional diagrams for describing a manner of destruction of laser element 201 by destruction needles 1204.

FIG 13 is a cross-sectional diagram for describing the way in which laser elements 201 are destroyed by destruction needles 1204.

As illustrated in FIG 13(a), cuts (see FIG 12(b)) for allowing laser light emitted by laser elements 201 to pass through are formed in beam 1205, and destruction needles 1204 are disposed in the peripheries of the respective cuts. Thus, as illustrated in FIG 13(b), even if beam 1204 moves toward laser elements 201, destruction needles 1204 do not directly hit semiconductor lasers 901, but glasses 904 are destroyed, whereby first, the sealed state of can-type laser elements 201 is lost. Furthermore, pieces of broken glasses 904 damage semiconductor lasers 901, whereby laser elements 201 are destroyed.

Figure 14:
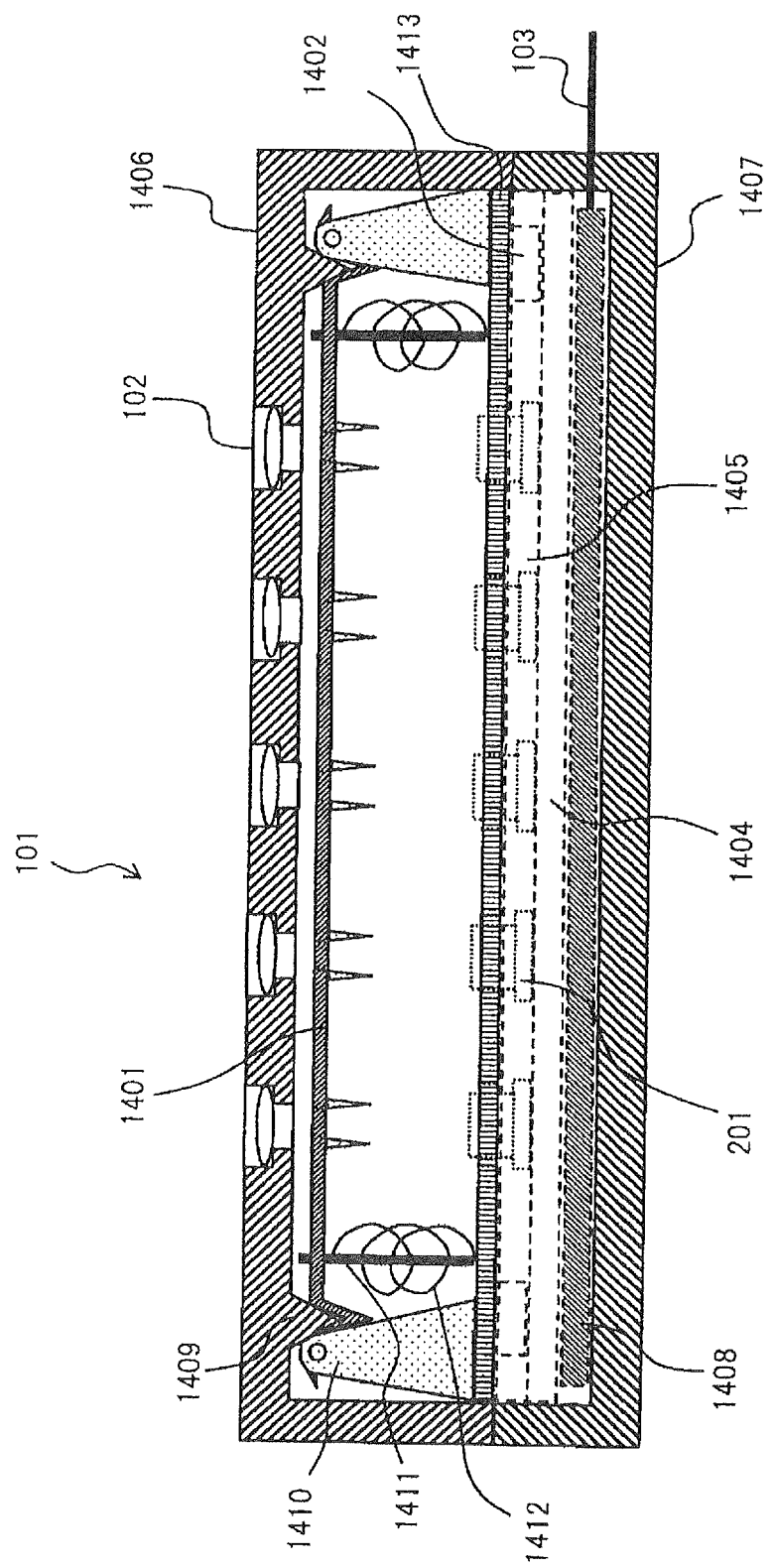
FIG. 14 is a cross-sectional diagram illustrating another exemplary embodiment of a structure that, if laser array unit 101 is disassembled or destroyed, destroys laser elements 201 in laser array unit 101 illustrated in FIG 1.

FIG 14 is a cross-sectional diagram illustrating another exemplary embodiment of a structure that, if laser array unit 101 is disassembled or destroyed, destroys laser elements 201 in laser array unit 101 illustrated in FIG 1. In the present exemplary embodiment, laser element fixing substrate 1404 is housed in lower cover 1407, and upper cover 1406 and lower cover 1407 are directly combined, forming laser array unit 101.

In lower cover 1407, circuit substrate 1408, laser element substrate 1404, laser elements 201 and holding plate 1405 are housed. Configurations and operations of circuit substrate 1408, laser element fixing substrate 1404 and holding plate 1405 are similar to those of circuit substrate 208, laser element fixing substrate 204 and holding plate 205 illustrated in FIG 2.

In upper cover 1406, collimating lenses 102 are housed. In the present exemplary embodiment, a mechanism that, if upper cover 1406 and lower cover 1407 are separated, destroys laser elements 201 is incorporated, and in upper cover 1406, projections 1409 for preventing the destruction mechanism from operating in a state in which upper cover 1406 and lower cover 1407 are combined are provided.

Figure 15:
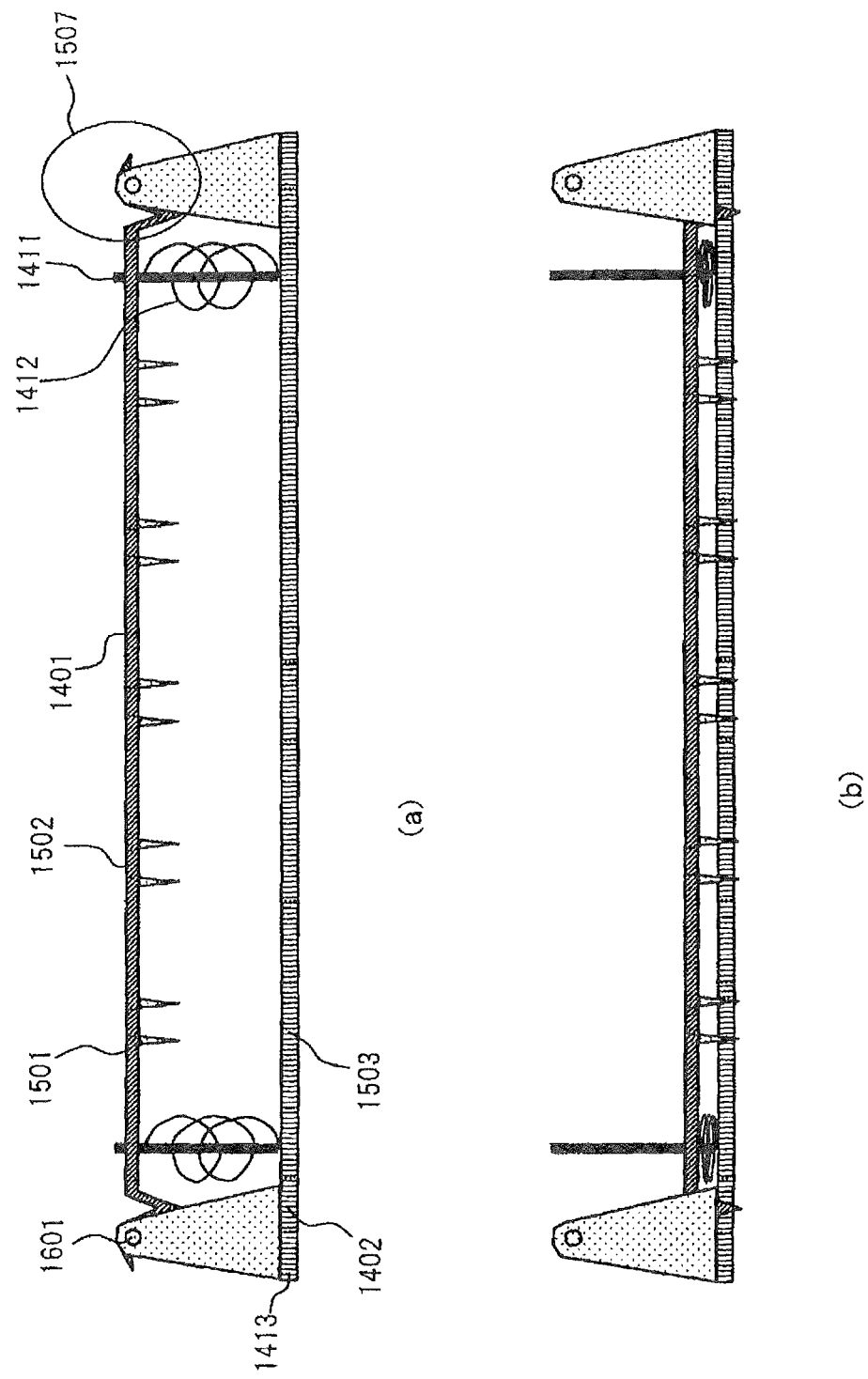
FIG. 15 includes cross-sectional diagrams illustrating a mechanism that destroys laser elements 201 according to the exemplary embodiment illustrated in FIG 14.

FIG 15 includes cross-sectional diagrams illustrating a destruction mechanism that destroys laser elements 201: FIG 15(a) illustrates a state in which upper cover 1406 and lower cover 1407 are combined; FIG 15(b) illustrates a state in which upper cover 1406 and lower cover 1407 are separated, whereby laser elements 201 are destroyed. A mechanism that destroys laser elements 201 will be described with reference to FIG 15 as well as FIG 14.

The mechanism that destroys laser elements 201 includes support substrate 1413, the pair of supports 1410 standing on support substrate 1413, beam 1401 placed between supports 1410, springs 1412 provided between beam 1401 and support substrate 1413, springs 1412 that bias beam 1401 toward laser elements 201, and guide bars 1411 that restrict the direction of movement of beam 1401.

In parts of beam 1401 that correspond to laser elements 201, destruction needles 1501 that destroy laser elements 201 and laser beam passage holes 502 for allowing laser light to pass through are formed. Beam 1401 is placed (positioned) between supports 1410 by placing (positioning) trap set sections 1507, that are formed at respective ends, on respective bars 1601 that are attached to respective supports 1504.

In support substrate 1413, holes 1503 for laser elements for allowing laser elements 201 to protrude therethrough, and stop receiving holes 1402 for receiving respective trap set sections 1507 in a state in which laser elements 201 are destroyed, which is illustrated in FIG 15(b).

Figure 16:
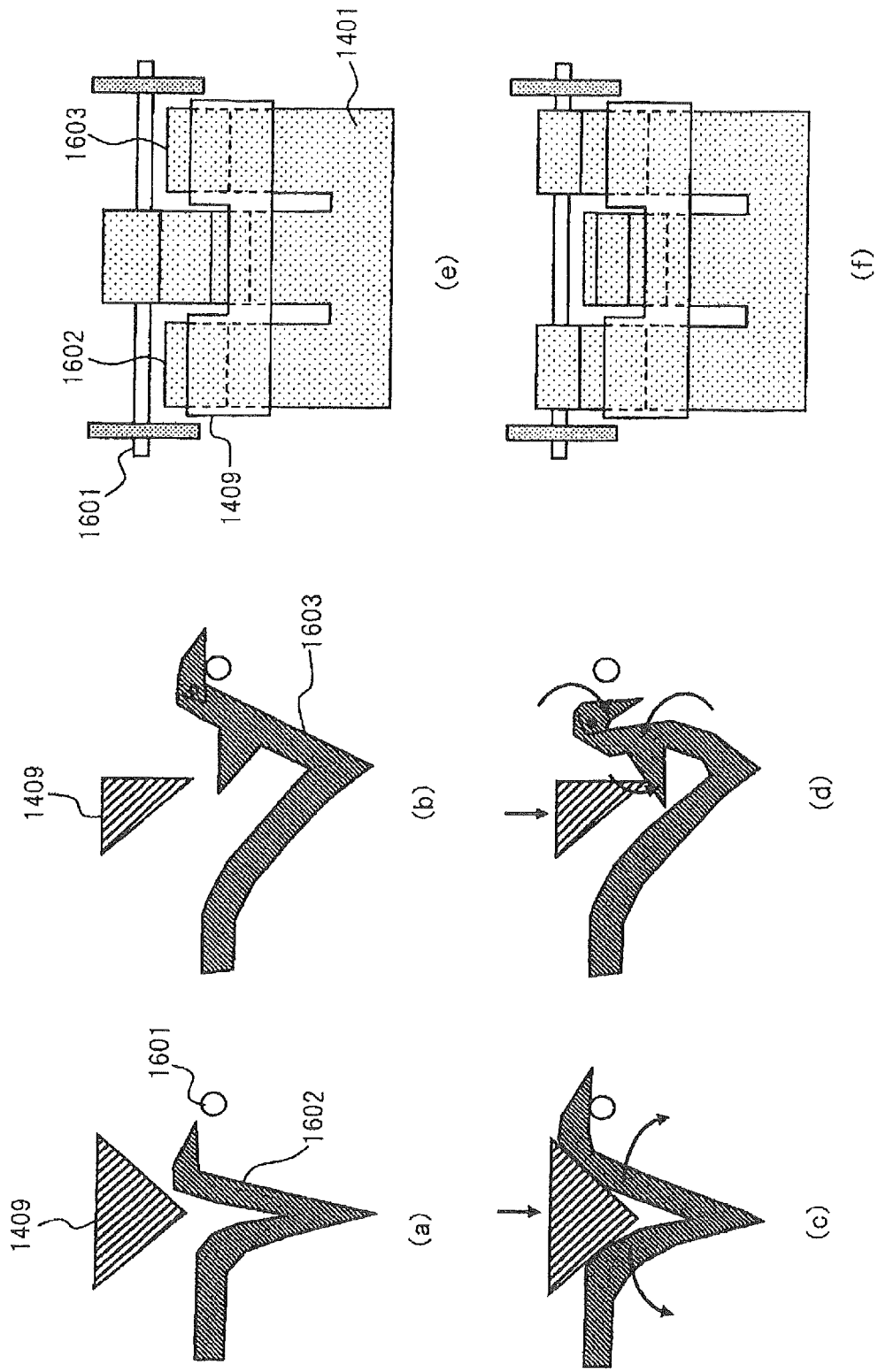
FIG. 16 includes diagrams illustrating a detailed configuration of trap set section 1507 in the exemplary embodiment illustrated in FIG 14.

FIG 16 includes diagrams illustrating a detailed configuration of trap set section 1507: FIGS. 16(a) and 16(b) are cross-sectional diagrams illustrating the state before upper cover 1406 is attached; FIGS. 16(c) and 16(d) are cross-sectional diagrams after attachment of upper cover 1406, FIG 16(e) is a top view illustrating the state before upper cover 1406 is attached, and FIG 16(f) is a top view illustrating the state after attachment of upper cover 1406.

As illustrated in FIG 16(e), at each of ends of beam 1401, initial holding stop 1601 formed at a center thereof, and at each of both sides of initial holding stop 1601, trap set stop 1602 is found. As illustrated in FIGS. 16(a) and 16(b), each of trap set stops 1602 and initial holding stop 1601 includes a flexure formed by flexing an end thereof in a V-shape and an edge that protrudes outward.

The edge of each trap set stop 1602 does not reach corresponding bar 1601 in the free state illustrated in FIG 16(a), but when upper cover 1406 is closed, as illustrated in FIG 16(c), protrusion 1409 enters the flexure, whereby the flexure extends by pressure and the edge thereof is put on bar 1601.

The edge of each of initial holding stops 1601 is put on corresponding bar 1601 in the free state. The edge of initial holding stop 1601 can rotate clockwise from the state illustrated in FIG 16(b), and locked so as not to rotate counter-clockwise. At an inner wall on the end side of the flexure of initial holding stop 1601, a protrusion that protrudes inward is provided.

When upper cover 1406 is closed, as illustrated in FIG 16(d), protrusion 1409 enters the flexure and thereby presses the protrusion, whereby initial holding stop 1601 rotates toward the inside of the flexure, whereby the edge comes off from bar 1601, and the edge rotates clockwise, resulting in the state illustrated in FIG 16(f).

In the laser element destruction mechanism according to the present exemplary embodiment, which is configured as described above, operation of the laser element destruction mechanism is prevented by initial holding stops 1601 before attachment of upper cover 1406, and operation of the laser element destruction mechanism is prevented by trap set stops 1602 after attachment of upper cover 1406. Subsequently, if upper cover 1406 and lower cover 1407 are separated, trap set stops 1602 come off from respective bars 1601 and beam 1401 falls, resulting in the state illustrated in FIG 15(b), whereby laser elements 201 are destroyed.

FIGS. 17 and 18 include cross-sectional diagrams illustrating another exemplary embodiment of a structure that, if laser array unit 101 is disassembled or destroyed, destroys laser elements 201 in laser array unit 101 illustrated in FIG 1. In the present exemplary embodiment, upper cover 1801 and lower cover 1708 are directly combined, forming laser array unit 101.

FIG 17(a) is a top view illustrating a state in which upper cover 1801 is not attached, and FIGS. 17(b), 17(c) and 17(d) are a cross-sectional view taken along line A-A', a cross-sectional view taken along line B-B' and a cross-sectional view taken along line C-C' in FIG 17(a).

As illustrated in FIG 17(b), in lower cover 1708, circuit substrate 1710 is housed. A configuration and an operation of circuit substrate 1710 are similar to those of circuit substrate 208 illustrated in FIG 2.

In the present exemplary embodiment, laser elements 201 are destroyed by needles 1703 formed at roller 1704. Opposite ends of roller 1704 are pivotally supported by respective spring holders 1704, and at a part of each of the opposite ends, gear 1702 is circumferentially provided. As illustrated in FIG 17(d), each spring holder 1706 biased by respective spring 1707 moves in parallel to a surface on which laser elements 201 are arranged along corresponding guide 1709 inserted through the inside.

As a mechanism for locking spring holders 1706, stoppers 1705 are provided. FIG 18 is a diagram illustrating a set state and the way in which laser elements in the present exemplary embodiment are destroyed. A protrusion amount of each protruding stopper 1706 changes between two different states each time stopper 1705 is pressed, in the state illustrated in FIGS. 17(a) and 18(a), the protrusion amount is large and stopper 1705 locks corresponding spring holder 1706.

At each of parts of upper cover 1801 that correspond to stoppers 1705, as illustrated in FIG 18(b), a gentle protrusion is formed, and when upper cover 1801 is closed, stoppers 1705 are pushed toward respective parts from which stoppers 1705 protrude, and illustrated in FIG 18(c), stoppers 1705 change to a state in which the protrusion amount is small, and spring holders 1706 are locked only by protrusions of upper cover 1801. Subsequently, if upper cover 1801 is removed, spring holders 1706 enter a free state, spring holders 1706 and roller 1704 are pushed by springs 1707 and thereby move upward from the bottom in FIG 17(a).

As illustrated in FIG 17(c), gears 1702 engage with respective racks 1701, and thus, as illustrated in FIG 18(d), at the time of movement by release of spring holders 1706, roller 1704 moves while rotating, whereby laser elements 201 are destroyed by needles 1703.

In the exemplary embodiments described above, a laser array unit using a plurality of laser elements has been described as an example of a laser unit used for a laser light source module. Such laser array unit is often used for an increase in power; however, even a single laser element can be used for a laser array unit as long as such single laser element has high power, and it can be understood that the present invention is applicable to such a case.

Also, although the description has been provided taking needles as an example of those that destroy laser elements, destruction elements are not limited to needles and may be any destruction elements that can destroy laser elements, for example, blades.

The present invention claims priority of Japanese Patent Application No. 2011-001.866 filed on Jan. 7, 2011, the entire disclosure of which is incorporated herein by reference.

REFERENCE SIGNS LIST 101 laser array unit
102 collimating lens
103 wiring
201 laser element
204 laser element fixing substrate
205 holding plate
206 upper cover
207 lower cover
208 circuit substrate
209 cooling unit
210 protrusion
301 projector
302 password reception circuit
303 password determination circuit
304 laser element disabling circuit
401 password storage non-volatile memory
402 password temporary storage memory
403 password & switch count counter
404 comparison circuit
405 determination circuit

The invention claimed is:
1. A laser light source module including a laser element that emits laser light, the laser light source module being formed by combination of a plurality of members, the laser light source module comprising:

a laser element drive circuit including a memory that stores a password, said laser element drive circuit making said laser element emit laser light if an input password that has been input matches the password stored in said memory;

a laser element destruction mechanism that, if the plurality of members are separated, destroys said laser element such that the laser element is prevented from emitting laser light;

a laser element fixing substrate on which said laser element is mounted;

an upper cover that covers an upper surface of the laser element fixing substrate; and a lower cover that covers a lower surface of the laser element fixing substrate, wherein the laser element destruction mechanism comprises:
  a first laser element destruction mechanism that, if said upper cover is removed from said laser element fixing substrate, destroys said laser element; and
  a second laser element destruction mechanism that, if said lower cover is removed from said laser element fixing substrate, destroys said laser element.

2. A laser light source module including a laser element that emits laser light, the laser light source module being formed by combination of a plurality of members, the laser light source module comprising:

a laser element drive circuit including a memory that stores a password, said laser element drive circuit making said laser element emit laser light if an input password that has been input matches the password stored in said memory;

a laser element destruction mechanism that, if the plurality of members are separated, destroys said laser element such that the laser element is prevented from emitting laser light;

a laser element fixing substrate on which said laser element is mounted;

an upper cover that covers an upper surface of the laser element fixing substrate;

a lower cover that covers a lower surface of the laser element fixing substrate, wherein the laser element destruction mechanism comprises:
  a first laser element destruction mechanism that, if said upper cover is removed from said laser element fixing substrate, destroys said laser element; and
  a second laser element destruction mechanism that, if said lower cover is removed from said laser element fixing substrate, destroys said laser element, and
wherein said laser element drive circuit includes:
  a laser element disabling circuit capable of disabling said laser element; and
  a password determination circuit that if an input password does not match the password stored in said memory a number of times exceeding a predetermined number of times, disables said laser element via said laser element disabling circuit.

3. A laser light source module including a laser element that emits laser light, the laser light source module being formed by combination of a plurality of members, the laser light source module comprising:

a laser element drive circuit including a memory that stores a password, said laser element drive circuit making said laser element emit laser light if an input password that has been input matches the password stored in said memory;

a laser element destruction mechanism that, if the plurality of members are separated, destroys said laser element such that the laser element is prevented from emitting laser light; and an upper cover is formed on an upper surface of a substrate, the laser element being formed on the upper surface of the substrate, wherein the laser element destruction mechanism comprises:
  a beam positioned between the laser element and the upper cover; and
  a laser element destruction member formed on a side of the beam which faces the laser element.

4. The laser light source module according to claim 3, wherein the laser element destruction mechanism further comprises:
  a holder formed on a side of the beam which faces the upper cover, the holder engaging a recess formed in the upper cover.

5. The laser light source module according to claim 4, further comprising:
  a lower cover formed on a lower surface of the substrate which is opposite the upper surface,
wherein the laser element destruction mechanism further comprises:
  a disengagement section formed on a protrusion which protrudes from a surface of the lower cover which faces the substrate; and
  a connector which is pivotably connected to the beam and the disengagement section, and presses the beam toward the upper cover.

6. The laser light source module according to claim 5, wherein the laser element destruction mechanism further comprises:
  a biasing member which biases the beam in the direction of the substrate, an engagement between the holder and the recess in the upper cover acting against a bias of the biasing member,
wherein if at least one of the upper cover and lower cover is separated from the substrate, then the holder becomes disengaged from the recess in the upper cover, and the biasing member moves the beam toward the substrate such that the laser element destruction member impacts the laser element.

7. A laser array unit, comprising:
a laser element formed on a substrate;
a cover formed on the substrate; and
a laser element damaging device which damages the laser element if the cover is separated from the substrate
wherein the cover comprises an upper cover formed on an upper surface of the substrate, the laser element being formed on the upper surface of the substrate, and
wherein the laser element damaging device comprises:
  a beam positioned between the laser element and the upper cover; and
  a laser element damaging member formed on a side of the beam which faces the laser element.

8. The laser array unit of claim 7, wherein the laser element damaging device further comprises:
  a holder formed on a side of the beam which faces the upper cover, the holder engaging a recess formed in the upper cover.

9. The laser array unit of claim 8, wherein the cover further comprises a lower cover formed on a lower surface of the substrate which is opposite the upper surface.

10. The laser array unit of claim 9, wherein the laser element damaging device further comprises:
- a disengagement section formed on a protrusion which protrudes from a surface of the lower cover which faces the substrate; and
- a connector which is pivotably connected to the beam and the disengagement section, and presses the beam toward the upper cover.

11. The laser array unit of claim 10, wherein the laser element damaging device further comprises:
- a biasing member which biases the beam in the direction of the substrate, an engagement between the holder and the recess in the upper cover acting against a bias of the biasing member,
- wherein if at least one of the upper cover and lower cover is separated from the substrate, then the holder becomes disengaged from the recess in the upper cover, and the biasing member moves the beam toward the substrate such that the laser element damaging member impacts the laser element.

12. The laser array unit of claim 11, wherein a housing chamber is formed in the substrate and the disengagement section comprises:
- a pressing member formed in the housing chamber; and
- a connecting member to which the connector is pivotably connected, the connecting member being connected to the pressing member by a spring which biases the connecting member toward the upper cover,
- wherein if the lower cover is separated from the substrate, then the pressing member and connecting member move in a direction of the lower cover, such that the holder becomes disengaged from the recess in the upper cover.

13. The laser array unit of claim 8, wherein a hole is formed in a part of the beam that corresponds to the laser element, such that laser light emitted from the laser element exits via the hole, the laser element damaging member being formed adjacent to the hole at a position on the beam which corresponds to the laser element when the holder and recess are in a disengaged state.

* * * * *